United States Patent
Buffington (10) Patent No.: US 7,626,821 B1
(45) Date of Patent: Dec. 1, 2009

(54) ADAPTOR FOR GRAPHICS MODULE

(75) Inventor: Charles E. Buffington, Santa Clara, CA (US)

(73) Assignee: NVIDIA Corporation, Santa Clara, CA (US)

( * ) Notice: Subject to any disclaimer, the term of this patent is extended or adjusted under 35 U.S.C. 154(b) by 69 days.

(21) Appl. No.: 11/944,139

(22) Filed: Nov. 21, 2007

Related U.S. Application Data (60) Provisional application No. 60/869,590, filed on Dec. 12, 2006.

(51) Int. Cl.
*H05K 7/20* (2006.01)
(52) U.S. Cl. .................. 361/719; 361/690; 361/695; 361/700; 174/15.2; 165/80.3; 165/104.26
(58) Field of Classification Search .......... 361/690, 361/695, 700, 704, 719
See application file for complete search history.

(56) References Cited

U.S. PATENT DOCUMENTS

| | | | |
|---|---|---|---|
| 6,671,177 B1 * | 12/2003 | Han | 361/719 |
| 6,754,077 B2 * | 6/2004 | Lo et al. | 361/700 |
| 7,019,974 B2 * | 3/2006 | Lee et al. | 361/700 |
| 7,170,757 B2 | 1/2007 | Driscoll et al. | |
| 7,248,264 B2 | 7/2007 | Diamond et al. | |
| 7,283,364 B2 * | 10/2007 | Refai-Ahmed et al. | 361/719 |
| 7,321,494 B2 * | 1/2008 | Han | 361/719 |
| 7,362,583 B2 * | 4/2008 | Refai-Ahmed et al. | 361/719 |
| 7,365,989 B2 * | 4/2008 | Peng et al. | 361/720 |
| 7,382,616 B2 * | 6/2008 | Stefanoski | 361/698 |
| 7,382,621 B2 * | 6/2008 | Peng et al. | 361/719 |
| 7,443,672 B2 * | 10/2008 | Peng et al. | 361/695 |

OTHER PUBLICATIONS

NVIDIA Corporation, "MXM Graphics Module—The First Consistent Graphics Interface for Notebook PCs", 2004.

* cited by examiner

*Primary Examiner*—Boris L Chervinsky
(74) *Attorney, Agent, or Firm*—Patterson & Sheridan, LLP (57) ABSTRACT

Embodiments of this invention relate generally to systems used to cool computer hardware and more particularly to an adaptor for a graphics module. In one embodiment a graphics card assembly is provided. The graphics card assembly includes a printed circuit board (PCB); a graphics processing unit (GPU) attached to the PCB; and an adaptor having first and second surfaces and made from a thermally conductive material. The adaptor is disposed on the PCB so that the first surface is in thermal communication with the GPU and the second surface providing a standard interface for thermal communication with a cooling system.

20 Claims, 7 Drawing Sheets

FIG. 1
(PRIOR ART)

(EXTERNAL ENVIRONMENT)

ADAPTOR FOR GRAPHICS MODULE

CROSS-REFERENCE TO RELATED APPLICATIONS

This application claims benefit of U.S. Provisional Patent Application Ser. No. 60/869,590, filed Dec. 12, 2006, which is herein incorporated by reference in its entirety.

BACKGROUND OF THE INVENTION

1. Field of the Invention

Embodiments of this invention relate generally to systems used to cool computer hardware and more particularly to an adaptor for a graphics module.

2. Description of the Background Art

Figure 1:
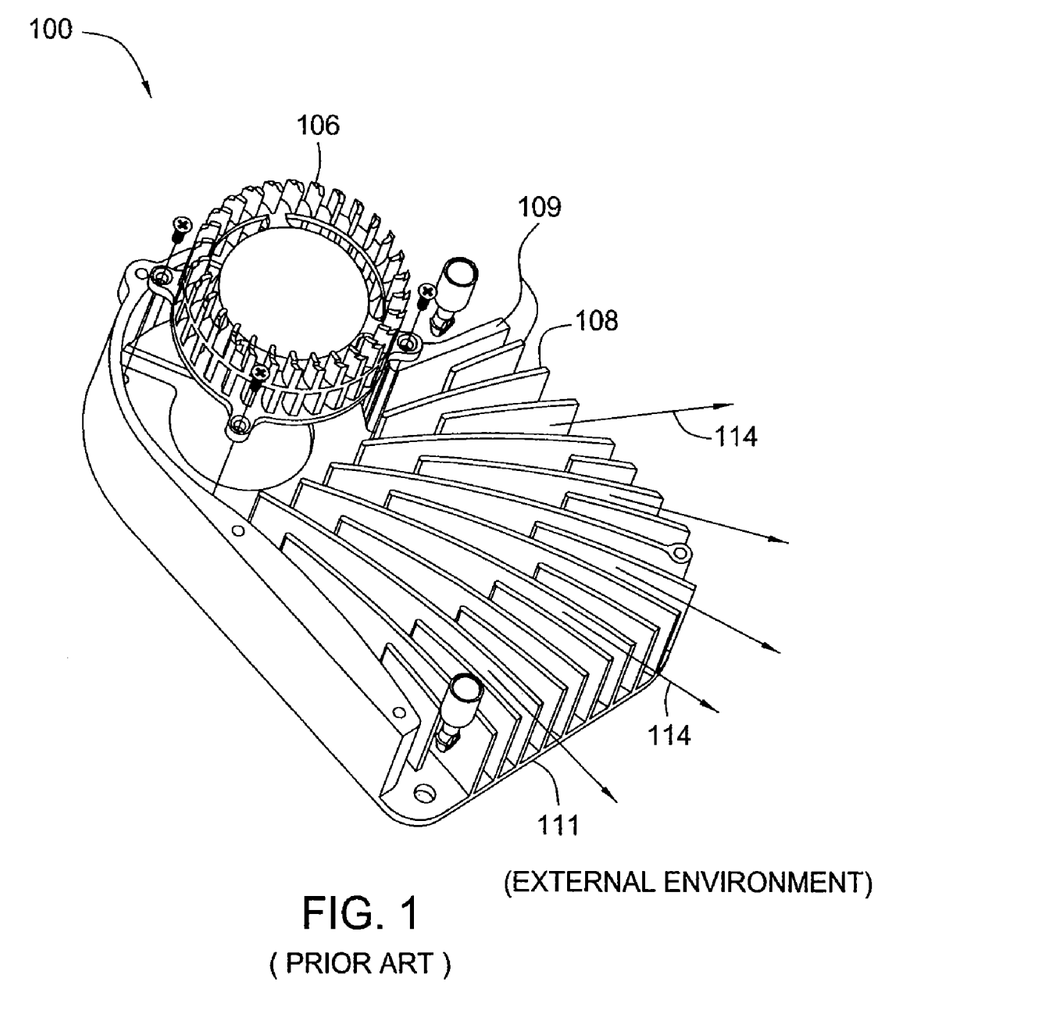
FIG. 1 is an isometric view illustrating a prior art system used to cool a processor.

FIG. 1 is an isometric view illustrating a prior art cooling system 100 used to cool a heat-generating electronic device, such as a graphics processing unit (GPU), in a computer. As shown, cooling system 100 characteristically includes a blower/fan 106, fins 109 and a bottom plate 111. Typically, cooling system 100 is thermally coupled to the GPU, for example using thermal adhesive or grease having thermal properties that facilitate transferring heat generated by the GPU to the bottom plate 111. Cooling system 100 may also include a heat sink lid (not shown), which, among other things, prevents particles and other contaminants from entering blower/fan 106 and air blown from blower/fan 106 from escaping cooling system 100. The heat sink lid, together with the fins 109 and the bottom plate 111, define a plurality of air channels 108.

Blower/fan 106 is configured to force air through air channels 108 over bottom plate 111 such that the heat generated by the GPU transfers to the air. The heated air then exits cooling system 100, as depicted by flow lines 114, thereby dissipating the heat generated by the GPU into the external environment. This process cools the GPU, preventing the device from overheating during operation. Air channels 108 are configured to direct air blown from blower/fan 106 over bottom plate 111 and into the external environment in a manner that most efficiently removes heat from the GPU.

Figure 2:
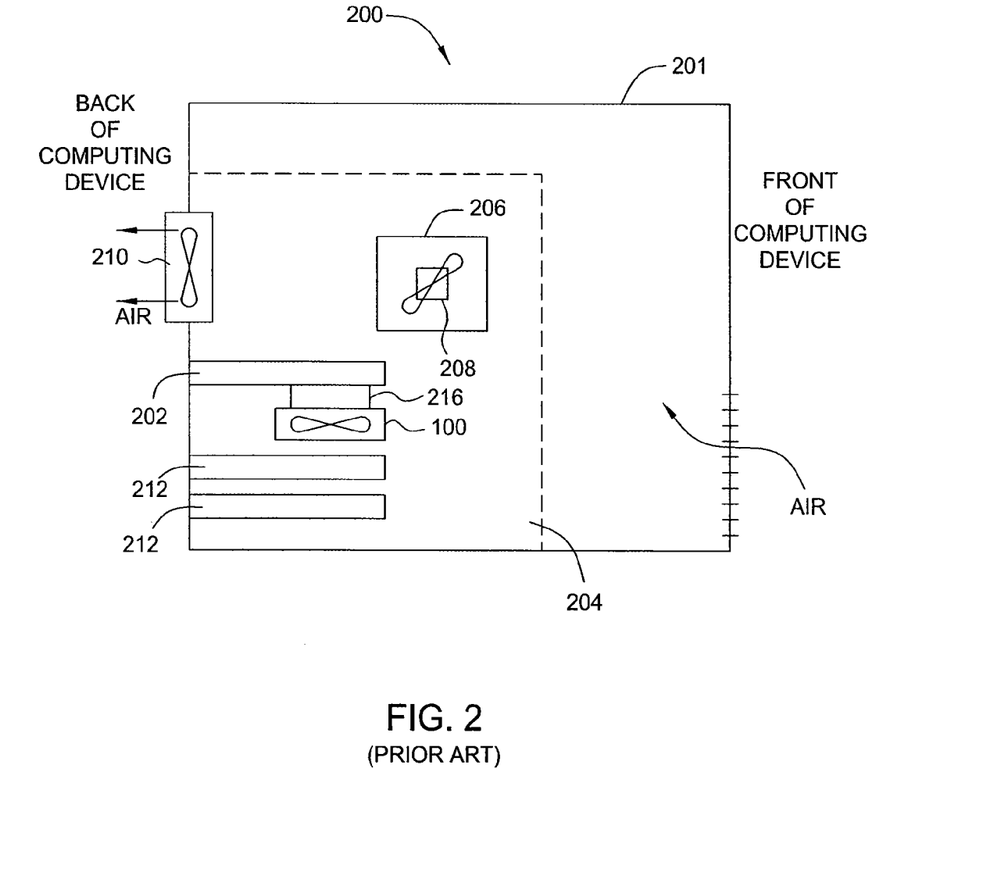
FIG. 2 is schematic diagram illustrating a prior art computing device adapted for use with the cooling system of FIG. 1.

FIG. 2 is a schematic diagram illustrating a prior art computer 200, such as a desktop, laptop, server, mainframe, set-top box, cellular phone, personal digital assistant (PDA) and the like within which the cooling system 100 for cooling the GPU 216 is incorporated. As shown, computer 200 includes a housing 201, within which a motherboard 204 resides. Mounted on motherboard 204 are a central processing unit (CPU) 206, a processor cooler 208 for cooling CPU 206, and one or more peripheral component interface (PCI) cards 212, each interfaced with a slot located in the back part of housing 201. A system fan 210 is attached to the housing 201 for removing heat from computer 200. Motherboard 204 further incorporates a graphics card 202 that enables computing device 200 to rapidly process graphics related data for graphics intensive applications such as gaming applications. Graphics card 202 includes a printed circuit board (PCB) upon which a plurality of circuit components (not shown), such as memory chips and the like, are mounted. In addition, graphics card 200 includes GPU 216, mounted to one face of graphics card 202, for processing graphics related data.

Because the computational requirements of GPU 216 are typically quite substantial, GPU 216 tends to generate a large amount of heat during operation. If the generated heat is not properly dissipated, the performance of GPU 216 degrades. For this reason, cooling system 100, which is configured to remove heat from GPU 216, is coupled to GPU 216.

Figure 3:
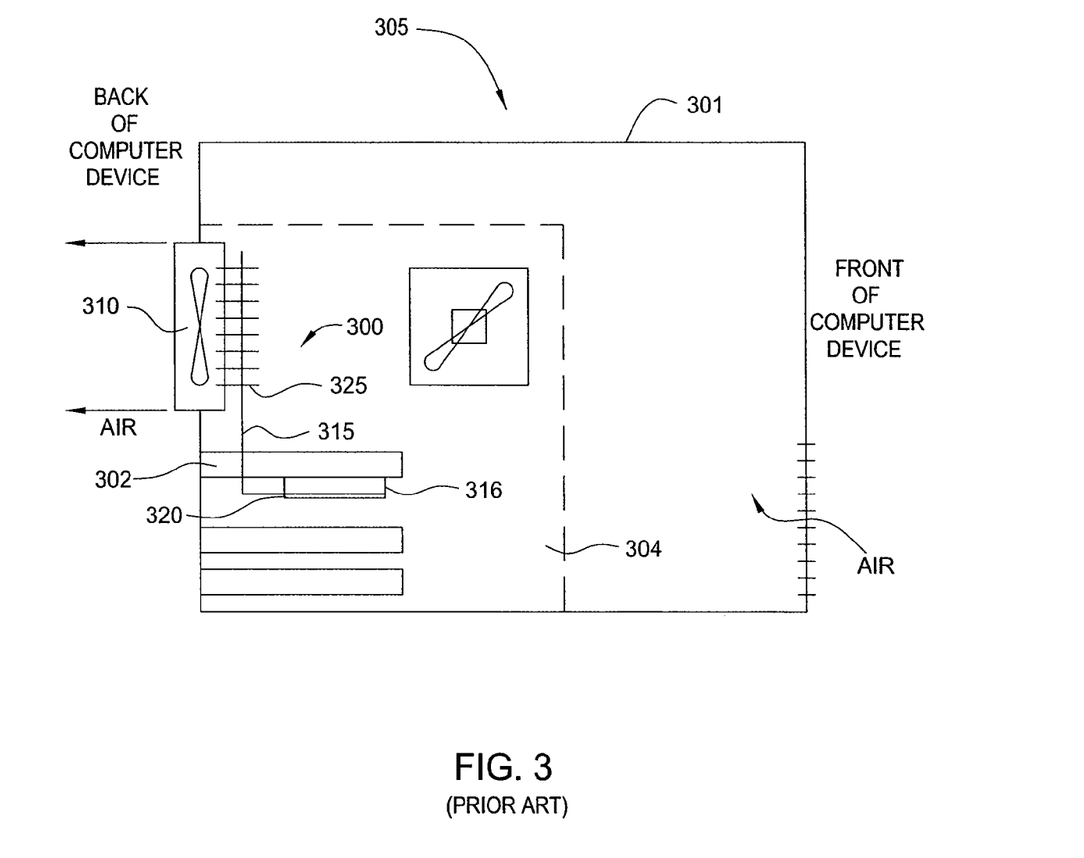
FIG. 3 is a schematic diagram illustrating a prior art computer having an alternative cooling system incorporated therein.

FIG. 3 is a schematic diagram illustrating a prior art computer 305 having an alternative cooling system 300 incorporated therein. Cooling system 300 is coupled to graphics card 302 in order to dissipate heat generated by the GPU 316 and other surface mounted components (not shown). Cooling system 300 is interfaced to graphics card 302 via a mounting plate 320 that is adapted for coupling to mounting holes on graphics card 302. Cooling system 300 further includes a passive heat transport device 315, such as a heat pipe, and a heat exchanger 325 coupled to GPU 316 using mounting plate 320. The heat pipe 315 is a passive heat transfer device, employing two-phase flow to achieve an extremely high thermal conductivity. The heat pipe 315 includes a vapor chamber and a wick structure which draws liquid (e.g. water) to a heat source (provided by the heat generated by the GPU 316 and transferred through the base 320) by the use of capillary forces. The liquid evaporates in the wick when heated and the resulting vapor escapes to the vapor chamber of the heat pipe where the vapor is then forced by a resulting pressure gradient to cooler regions of the heat pipe for condensation. The condensed liquid is then returned to the heat source via the capillary action. The cooler region of the heat pipe 315 is in thermal communication with a system fan 310 via heat exchanger 325.

Each of the graphics cards 202, 302 is modular, thereby having a standard connector that interfaces with a mating standard connector of a respective motherboard 204, 304. The configuration of the standard connector is governed by a standard, such as peripheral component interface express (PCI Express), mobile PCI Express module (MXM), peripheral component interface (PCI), and Accelerated Graphics Port (AGP). A modular graphics card allows for a user to upgrade the graphics card for a particular computer and/or allows an original equipment manufacturer (OEM) to offer different graphics cards for a particular computer.

Even though a particular graphics card complies with a particular standard, there is still substantial variation between graphics cards from different vendors and even different graphics cards from the same vendor. Parameters, such as placement of the GPU and/or memory units on a graphics card, dimensions of the graphics card, number of memory units, location of power supply, components that require cooling, height of components, etc., will vary such that one particular cooling system configured for a particular graphics card will not interface with another graphics card complying with the same standard. Therefore, if the graphics card for a particular computer is upgraded, then the cooling system for that graphics card must also be replaced. Replacement of the cooling system is cumbersome especially in small form factor computers, such as servers, laptops, and PDAs, where the cooling systems are very compact to accommodate limited space availability. Further, when a new graphics card is designed by a particular vendor, a new or substantially re-configured cooling system must also be designed.

As the foregoing illustrates, what is needed in the art is a standard interface between a graphics card and a cooling system.

SUMMARY OF THE INVENTION

Embodiments of this invention relate generally to systems used to cool computer hardware and more particularly to an adaptor for a graphics module. In one embodiment a graphics card assembly is provided. The graphics card assembly includes a printed circuit board (PCB); a graphics processing unit (GPU) attached to the PCB; and an adaptor having first and second surfaces and made from a thermally conductive material. The adaptor is disposed on the PCB so that the first surface is in thermal communication with the GPU and the second surface providing a standard interface for thermal communication with a cooling system.

The standard interface of the adaptor allows for various graphics cards to be used with a standard cooling system without custom configuration of the cooling system. The adaptor is customized for a particular graphics card instead of having to customize the base of the cooling system. The standard interface provided by the adaptor simplifies graphics card installation, simplifies cooling system design, and eliminates customization of a particular cooling system for a particular graphics card.

DETAILED DESCRIPTION OF THE INVENTION

Figure 4:
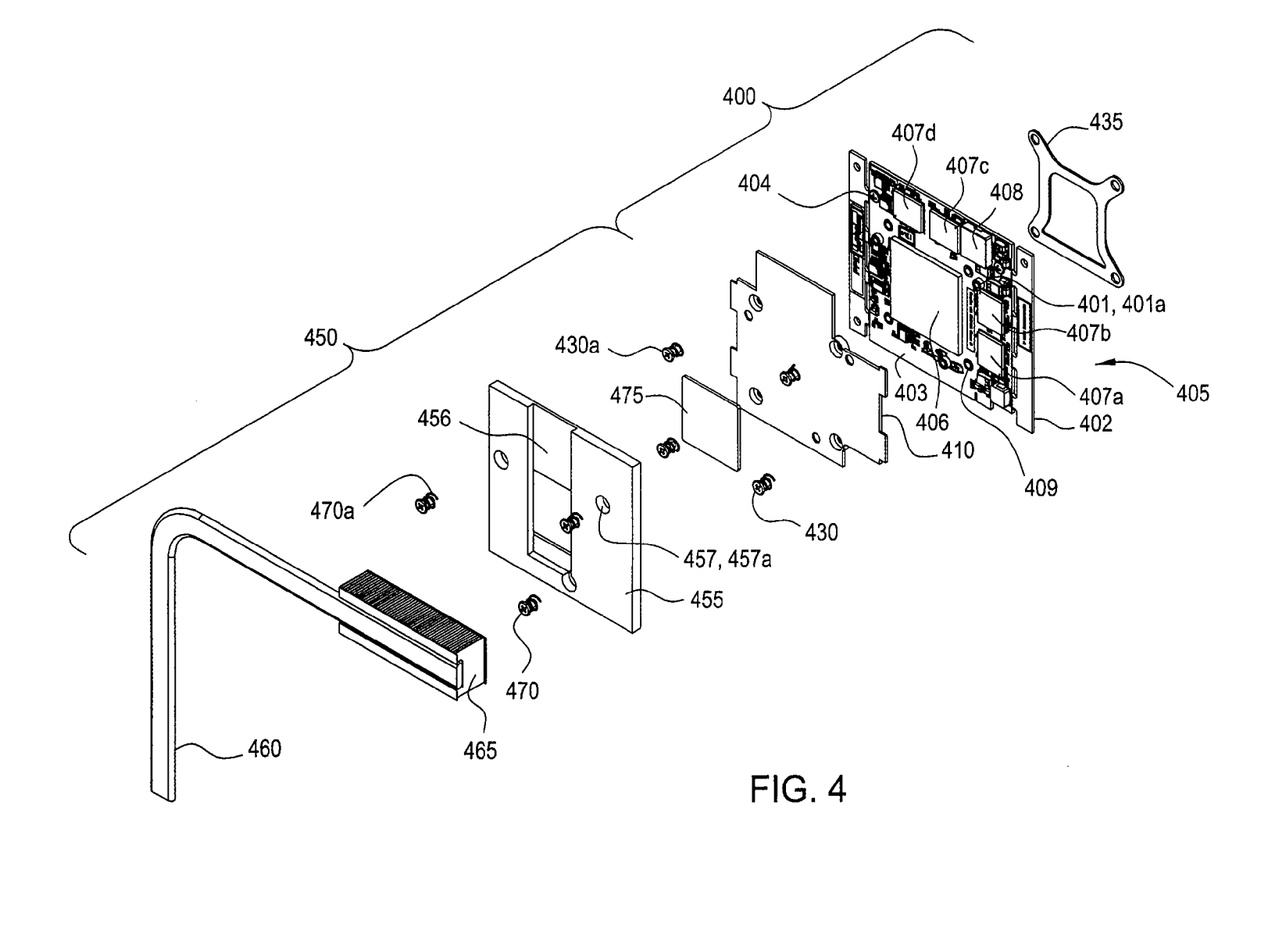
FIG. 4 is an exploded isometric view of a modular graphics card assembly and a portion of a cooling system for transferring heat from the graphics card assembly, according to one embodiment of the present invention.
Figure 4A:
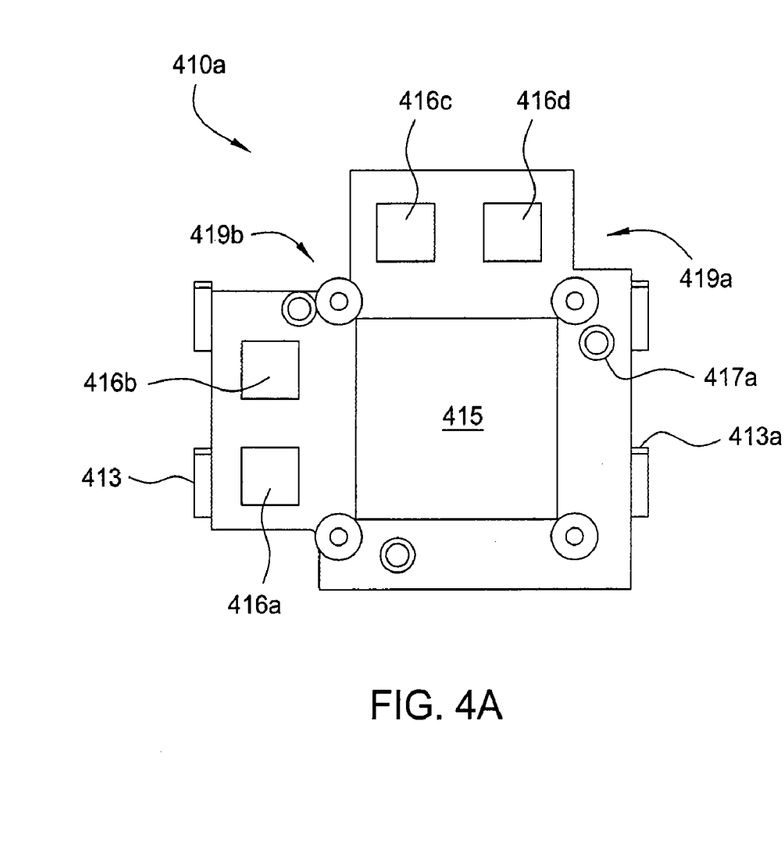
FIG. 4A is a plan view of a first surface of the adaptor of FIG. 4.
Figure 4B:
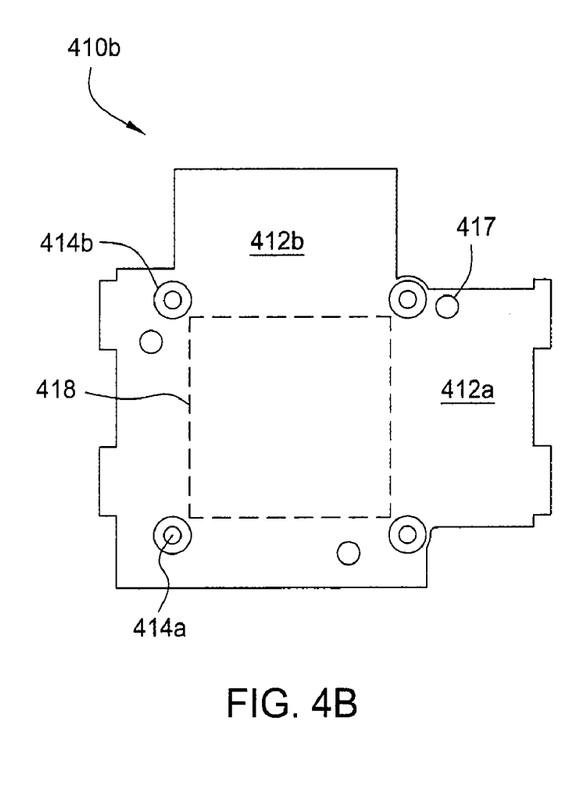
FIG. 4B is a plan view of a second surface of the adaptor of FIG. 4.

FIG. 4 is an exploded isometric view of a modular graphics card assembly 400 and a portion of a cooling system 450 for transferring heat from the graphics card assembly 400, according to one embodiment of the present invention. The graphics card assembly 400 includes a graphics card 405 and an adaptor 410. FIG. 4A is a plan view of a first surface 410a of the adaptor 410. FIG. 4B is a plan view of a second surface 410b of the adaptor 410. The graphics card 405 includes a PCB 402, a GPU 406 attached to the PCB 402, one or more memory units 407a-d attached to the GPU 406, and a connector 403 formed as part of the PCB 405. The connector 403 interfaces with a mating connector of a motherboard (not shown) of a computer (not shown). One or more fasteners, such as screws 404, may be provided and are received by respective standoffs (not shown) on the motherboard. As shown, the adaptor plate 410 and the graphics card 405 conform to the MXM standard, disclosed in the '590 Provisional. Alternatively, the adaptor plate 410 may be configured to conform to any standard for modular graphics cards, such as those listed above.

The adaptor 410 is made from a thermally conductive material, such as aluminum, copper, and alloys thereof. The adaptor 410 is mechanically coupled to the PCB 402 so that the first surface 410a of the adaptor is in thermal communication with the GPU 406 and the memory units 407a-d by one or more fasteners, such as screws 430. Disposed on each screw 430 is a biasing member, such as a spring 430a. Each screw is received in a respective hole 414a formed through the adaptor 410, a respective hole 409 formed through the PCB, and a respective threaded standoff (not shown) disposed through a hole formed through a back 435, thereby coupling the adaptor 410, the PCB 402, and the back 435 together. Alternatively, the back 435 may be omitted and each of the screws 430 may instead have toggled ends. Each spring 430a abuts a head of a respective screw 430 at one end and is received in a recess 414b formed in the second surface 410b of the adaptor 410 at the other end. A bushing or standoff 414c may line each of the holes 414a. The springs allow the adaptor 410 to float over the PCB 402 to ensure optimal thermal communication between the adaptor 410 and the GPU 406 and the memory units 407a-d.

The adaptor 410 includes a central portion and one or more optional extended portions 412a, b. The central portion includes a thermal transfer area (TTA) 418, which may vary according to a particular standard. Whether to include the extended portions 412a, b will be based on the cooling requirements of the particular graphics card 405. For example, an economical graphics card may only require cooling of the GPU whereas a more powerful graphics card may require cooling of the GPU and memory units and an even more powerful graphics card may require cooling of the GPU, the memory units, and one or more other components, such as a power supply. The central portion includes a recess 415 which receives the GPU 406 and the extended portions 412a, b and pads 416a-d extending from the first surface 410a for contacting the memory units 407a-d. The recess 415 and the pads 416a-d compensate for height variations between the GPU 406 and the memory units 407a-d and may be specifically configured for a particular graphics card.

The adaptor 410 may further include one or more cutout portions 419a, b. The cutout portions allow access to the motherboard screws 404. The cutout portion 419a also provides vertical space for a relatively tall component 408 of the graphics card 405. The vertical space provided by the cutout portion 408 also minimizes the required thickness of the adaptor 410, thereby also minimizing thermal resistance added by the adaptor 410. The height of the component 408 may exceed the height of the second surface 410b; however, if so, then the component 408 may be located at a side of the graphics card 402 opposite the connector 403 to allow flexibility in choosing a coupling mode (discussed below).

The cooling system 450 includes a base 455, an insert 475, an L-shaped heat pipe 460, and a heat exchanger, such as an array of fins 465. Alternatively, the cooling system 550 (see FIG. 5) may be used instead. The insert 475 is made from a thermally conductive material and is received in a window 457 formed through the base 455. Alternatively, the base 455 and the insert 475 may be formed as one integral member. The base 455 is mechanically coupled to the adaptor 410 so that the insert 470 is in thermal communication with the TTA 418 of the second surface 410b of the adaptor 410 by one or more fasteners, such as screws 470. Disposed on each screw 470 is a biasing member, such as a spring 470a. Each screw 470 is received in a respective hole 417 formed through the adaptor 410, and a respective hole 401 formed in the PCB 402, thereby coupling the base 455, the adaptor 410, and the PCB 402 together. A bushing or standoff 401a may line each of the holes 401 and a bushing or standoff 417a may line each of the holes 417. Each spring 470a abuts a head of a respective screw 470 at one end and is received in a recess 457a formed in a second surface of the base 455 at the other end. The springs allow the base 455 to float on the adaptor 410 to ensure optimal thermal communication between the base 455 and the adaptor 410.

Various alternative modes of coupling the adaptor to the base 455 may be used besides fasteners. The adaptor 410 includes one or more ears 413 formed at opposing sides thereof. In one of these alternative modes, the base 455 includes a clip (not shown) so that the adaptor ears 413 may actuate the clip open upon insertion into the computer. The clip would then be closed, thereby coupling the adaptor to the base. In another of these alternative modes, a chassis (not shown) of the computer includes a slot, similar to a PC Card (formerly PCMCIA card). A chamfer 413a of each of the ears 413 allows for the graphics card assembly 400 to slide along the first surface of the base 455 until the second surface 410b of the adaptor 410 aligned with the first surface of the base 455. In another of these alternative modes, the base 455 includes extensions (not shown) at opposing sides thereof each of which has a rail formed therein. The ears 413 would then be slid along the rails until the second surface 410b of the adaptor 410 aligned with the first surface of the base 455. In another of these alternative modes, the graphics card assembly 400 would be inserted into the computer until the second surface 410b of the adaptor 410 aligned with the first surface of the base 455 and then a slide (not shown) is then moved over each ear 413 and locked into place.

A portion of a first leg of the heat pipe 460 is received in a recess 456 formed in a second surface of the base 455, thereby providing thermal communication between the insert 475 and the heat pipe 460. A portion of a second leg of the heat pipe 460 is received in a recess formed in a first surface of the fin array 465. The fin array 465 is attached to the computer chassis in fluid communication with a system fan (not shown).

Figure 5:
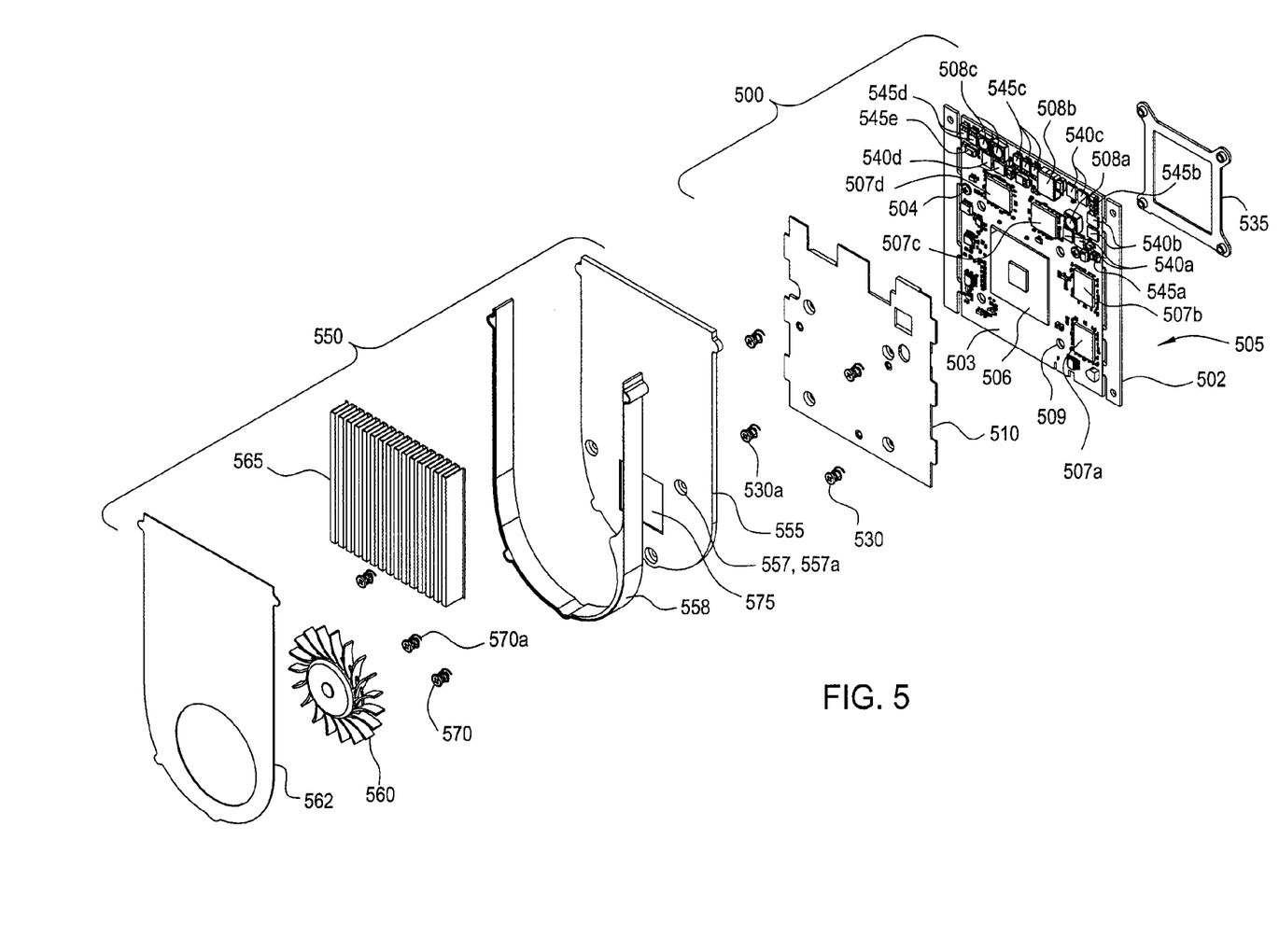
FIG. 5 is an exploded isometric view of a modular graphics card assembly and a cooling system for transferring heat from the graphics card assembly, according to another embodiment of the present invention.
Figure 5A:
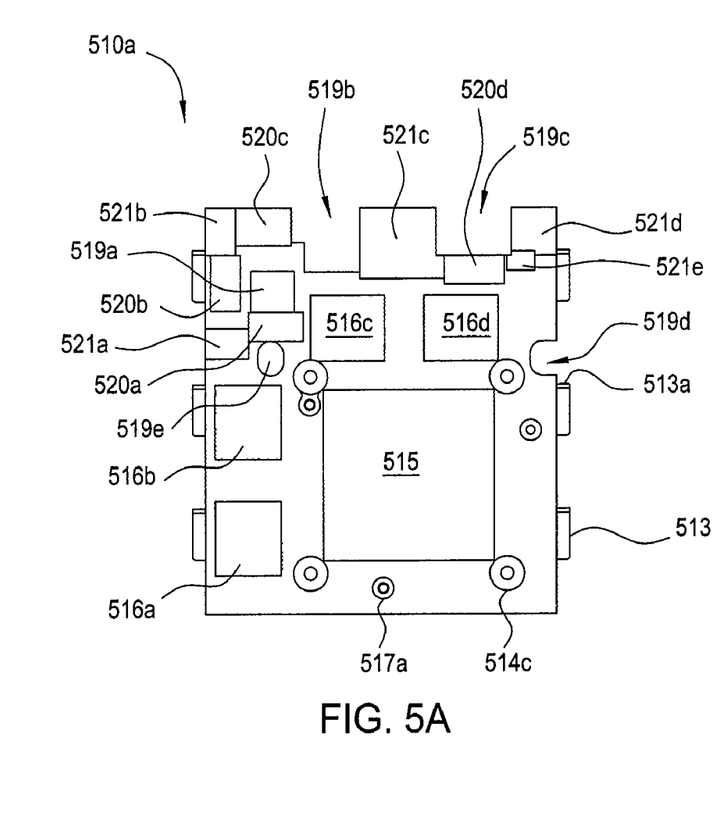
FIG. 5A is a plan view of a first surface of the adaptor of FIG. 5.
Figure 5B:
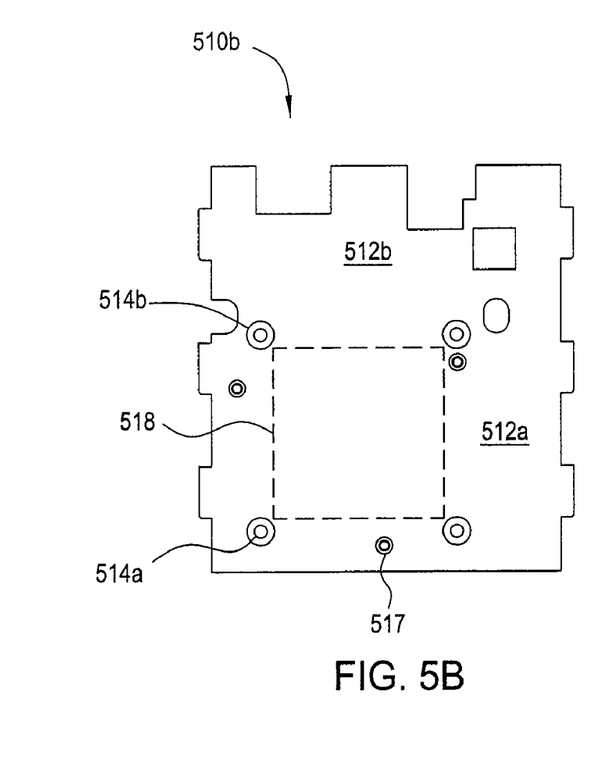
FIG. 5B is a plan view of a second surface of the adaptor of FIG. 5.

FIG. 5 is an exploded isometric view of a modular graphics card assembly 500 and a cooling system 550 for transferring heat from the graphics card assembly 500, according to another embodiment of the present invention. The graphics card assembly 500 includes a graphics card 505 and an adaptor 510. FIG. 5A is a plan view of a first surface 510a of the adaptor 510. FIG. 5B is a plan view of a second surface 510b of the adaptor 510. Mounting of the adaptor 510 to the graphics card 505 and connection of the graphics card 505 to the motherboard is similar to that of the FIG. 4 embodiment, discussed above. As shown, the adaptor plate 510 and the graphics card 505 conform to the MXM standard, disclosed in the '590 Provisional. Alternatively, the adaptor plate 510 may be configured to conform to any standard for modular graphics cards, such as those listed above.

The adaptor 510 is made from a thermally conductive material, such as aluminum, copper, and alloys thereof. The adaptor 510 includes a central portion and one or more optional extended portions 512a,b. The central portion includes a thermal transfer area (TTA) 518, which may vary according to a particular standard. Whether to include the extended portions 512a,b will be based on the cooling requirements of the particular graphics card 505, as discussed above. The central portion includes a recess 515 which receives the GPU 506 and the extended portions 512a, b and pads 516a-d extending from the first surface 510a for contacting the memory units 507a-d. The extended portion 512b further includes one or more pads 520a-d for contacting components 540a-d, respectively, and/or one or more recesses 521a-e for receiving components 545a-e, respectively, thereby providing thermal communication between these components and the adaptor. These components may be, for example, part of a power supply or other graphics card components. In one embodiment, component 540a is a portion of a power supply. The recesses and the pads compensate for height variations between the GPU, memory units, and the other components and may be specifically configured for a particular graphics card.

The adaptor 510 may further include a window 519a and/or one or more cutout portions 519b-e. The window 519a and the cutout portions 519b, c provide vertical space for relatively tall components 508a-c, respectively, of the graphics card 505, as discussed above. Each of the cutout portions 519d, e allow access to one of the motherboard screws 504.

The cooling system 550 includes a base 555, a side 558, an array of fins 565, a fan 560, and a lid 562. Alternatively, the cooling system 450 may be used instead. Note that, because of the adaptors 410, 510, the cooling systems 450, 550 may be interchanged without modification thereto, discussed below. The base 555 is made from a thermally conductive material and includes a pad 575 formed therein and extending from a first surface thereof. Alternatively, the pad 575 may be an insert. The base 555 is mechanically coupled to the adaptor 510 so that the pad 575 is in thermal communication with the TTA 518 of the second surface 510b of the adaptor 510 by one or more fasteners, such as screws 570. Disposed on each screw is a biasing member, such as a spring 570a. Each screw 570 is received in a respective threaded hole 517 disposed through the adaptor 510, thereby coupling the base 555 and the adaptor 510 together. Each of the holes 517 may be lined with a bushing or standoff 517a. Each spring 570a abuts a head of a respective screw 570 at one end and is received in a recess 557a formed in a second surface of the base 555 at the other end. The springs 570a allow the base 555 to float on the adaptor 510 to ensure optimal thermal communication between the base 555 and the adaptor 510.

The fin array 565 is mechanically coupled to the base 555 so that the fin array 565 is in thermal communication with the base 555. The fan 560 includes a motor (not shown) and is coupled to the base 555 so that the fan 560 may rotate relative to the base 555 and be in fluid communication with the fin array 565. The side 558 is coupled to the base 555 and the lid 562 is coupled to the side 558 so that air impelled by the fan is directed through the fin array 565. A hole is formed through the lid 562 to provide an inlet for the air. An outlet is formed in the side 558 to allow airflow to exit the cooling system 550.

The TTAs 418, 518 and/or second surfaces 410b, 510b of the adaptors 410, 510 each provide a standard interface for a cooling system, such as the cooling system 450 or 550. As long as a base/insert of the cooling system is configured to be placed in thermal communication with the TTA 418 or 518, the parameters discussed above may be varied without custom configuration of the cooling system. In some embodiments, the second surface of each of the adaptors 410, 510 provides a flat or substantially flat surface for mating with a base of the cooling system. Each of the first surfaces 410a, 510a of the adaptors 410, 510 is customized for a particular graphics card instead of having to customize the base of the cooling system. The standard interface provided by the adaptor simplifies graphics card installation, simplifies cooling system design, and eliminates customization of a particular cooling system for a particular graphics card.

Although the invention has been described above with reference to specific embodiments, persons skilled in the art will understand that various modifications and changes may be made thereto without departing from the broader spirit and scope of the invention as set forth in the appended claims. The foregoing description and drawings are, accordingly, to be regarded in an illustrative rather than a restrictive sense.

I claim:

1. A graphics card assembly, comprising:
a printed circuit board (PCB);
a graphics processing unit (GPU) attached to the PCB;
an adaptor having first and second surfaces and made from a thermally conductive material, the adaptor disposed on the PCB so that the first surface is in thermal communication with the GPU and the second surface is adapted to thermally connect to two or more different base plates, each base plate forming part of a different cooling system for the GPU.

2. The assembly of claim 1, wherein the second surface is substantially flat.

3. The assembly of claim 1, further comprising one or more memory units attached to the PCB, wherein the first surface of the adaptor is in thermal communication with the one or more memory units.

4. The assembly of claim 3, wherein the first surface is profiled to account for height variations between the GPU and the memory units.

5. The assembly of claim 3, further comprising a power supply, wherein the first surface of the adaptor is in thermal communication with the power supply.

6. The assembly of claim 1, further comprising a first cooling system, the first cooling system comprising a base plate in thermal communication with the second surface of the adaptor.

7. The assembly of claim 6, wherein the first cooling system further comprises a heat pipe in thermal communication with the base plate.

8. The assembly of claim 7, wherein the first cooling system further comprises a fin array in thermal communication with the heat pipe.

9. The assembly of claim 6, wherein the first cooling system further comprises a fin array disposed on the base plate and in thermal communication with the base plate, and a fan disposed on the base plate so that the fan may rotate relative to the base plate, the fan in fluid communication with the fin array.

10. The assembly of claim 1, wherein the adaptor has a first ear formed at a first side and a second ear formed at a second side, the second side opposite the first side.

11. The assembly of claim 10, wherein each of the ears has a chamfered end.

12. The assembly of claim 1, wherein the graphics card assembly is configured for a small form factor computer.

13. An adaptor made from a thermally conductive material and configured to be coupled to a printed circuit board (PCB), the adaptor comprising:
a first surface that includes:
a recess configured to be thermally coupled to a graphics processing unit (GPU) disposed on the PCB, and
one or more pads configured to be thermally coupled to one or more memory units disposed on the PCB, wherein the recess and the one or more pads compensate for height differences between the GPU and the one or more memory units; and
a second surface that includes:
a thermal transfer area configured to thermally connect the second surface to two or more different base plates, each base plate forming part of a different cooling system for the GPU, wherein the second surface is configured to be coupled to the two or more different base plates via a plurality of fasteners that each includes a biasing member, wherein the biasing member causes the two or more different base plates to float on the second surface of the adaptor.

14. The adaptor of claim 13, wherein plurality of fasteners comprises a plurality of screws, and the biasing member comprises a spring.

15. The adaptor of claim 13, wherein the first surface of the adaptor further includes a first pad configured to be thermally coupled to a power supply included in the PCB.

16. The adaptor of claim 13, wherein the first surface of the adaptor is configured to be coupled to the PCB via one or more fasteners that each includes a different biasing member, wherein the different biasing members cause the adaptor to float over the PCB and to allow the first surface of the adaptor to be thermally coupled to the GPU and to the memory units.

17. The adaptor of claim 16, wherein the one or more fasteners each comprises a screw, and the different biasing members each comprises a spring.

18. The adaptor of claim 16, further comprising one or more cutout portions.

19. The adaptor of claim 18, wherein the one or more cutout portions allow access to the one or more fasteners.

20. The adaptor of claim 19, wherein the one or more cutout portions accommodate a vertically oriented component coupled to the PCB.

* * * * *